United States Patent

Shelton et al.

[11] Patent Number: 6,090,724
[45] Date of Patent: Jul. 18, 2000

[54] METHOD FOR COMPOSING A THERMALLY CONDUCTIVE THIN FILM HAVING A LOW DIELECTRIC PROPERTY

[75] Inventors: Gail D. Shelton; Gayle W. Miller, both of Colorado Springs, Colo.

[73] Assignee: LSI Logic Corporation, Milpitas, Calif.

[21] Appl. No.: 09/211,922

[22] Filed: Dec. 15, 1998

[51] Int. Cl.$^7$ ............................................. H01L 21/469
[52] U.S. Cl. .......................... 438/781; 438/624; 438/782
[58] Field of Search ................... 438/597, 624, 438/791, 782, 780

[56] References Cited

U.S. PATENT DOCUMENTS

| | | | |
|---|---|---|---|
| 4,323,914 | 4/1982 | Berndlmaier et al. | 357/82 |
| 4,987,101 | 1/1991 | Kaanta et al. | 437/228 |
| 5,453,406 | 9/1995 | Chen | 438/634 |
| 5,494,858 | 2/1996 | Gnade et al. | 437/231 |
| 5,504,042 | 4/1996 | Cho et al. | 437/247 |
| 5,519,250 | 5/1996 | Numata . | |
| 5,536,965 | 7/1996 | Beratan et al. . | |
| 5,552,337 | 9/1996 | Kwon et al. . | |
| 5,627,082 | 5/1997 | Beratan et al. | 438/55 |
| 5,656,848 | 8/1997 | Beratan et al. | 257/446 |
| 5,728,628 | 3/1998 | Havemann | 438/668 |
| 5,744,865 | 4/1998 | Jeng et al. . | |
| 5,780,103 | 7/1998 | Toebben et al. | 427/226 |

OTHER PUBLICATIONS

Protection of Underlying Structure in the Parylene or Polymer patterning Process; IBM technical Disclosure Bulletin, May, 1983; pp. 6358–6359.

*Primary Examiner*—Caridad Everhart

[57] ABSTRACT

A method for composing a low dielectric thermally conductive thin film is disclosed. A layer of precursor material is first deposited on a silicon substrate. Without affecting its structure and porosity, the layer of silica precursor material is then dried and becomes a layer of porous silica film. Subsequently, the silicon substrate is exposed to a methane gas atmosphere at a temperature of approximately 200–350° C., during which methane gas molecules are oxidized locally to liberate carbon atoms. Some of the liberated carbon atoms will bond to the interior of the porous silica film. The carbon atoms from the methane gas molecules then permeate the nanopores within the porous silica film such that the entire nanostructure of the porous silica film is carbidized. As a result, a composite porous silica film, which may serve as a dielectric layer within an interconnect structure, is formed.

7 Claims, 1 Drawing Sheet

METHOD FOR COMPOSING A THERMALLY CONDUCTIVE THIN FILM HAVING A LOW DIELECTRIC PROPERTY

BACKGROUND OF THE INVENTION

1. Technical Field

The present invention relates to semiconductor devices in general, and in particular to a method for composing a dielectric thin film within a multilayer semiconductor device. Still more particularly, the present invention relates to a method for forming a low dielectric thermally conductive thin film within a multilayer semiconductor device.

2. Description of the Prior Art

Within an integrated circuit (IC) device, various electrical components are formed on a semiconductor substrate. These electrical components are normally interconnected with metal lines that are typically formed by a combination of processes such as deposition, masking, and etching, collectively referred to as metalization.

Generally speaking, metalization begins with masking, which includes etching small openings called contacts or vias through all upper layers down to the active regions of a substrate. A conductive metal film is then deposited by techniques such as vacuum evaporation, sputtering, or chemical vapor deposition. Thin metals lines may be formed on the upper surface by either one of the following two methods. The first method is by etching a thin metal film (typically aluminum alloy and its barrier stack) with the assistance of a mask. The second method entails etching trenches into the dielectric layer prior to the metal deposition and subsequent removing the unwanted portions of conductive material (typically copper and its barrier stack) by chemical-mechanical polishing.

As chip density increases, a multi-level interconnect structure is generally more desirable than the single-level interconnect structure described above. A multi-level interconnect structure typically begins with a standard metalization process that leaves the surface components partially wired together. Next, a layer of dielectric material is deposited on top of the partially wired structure. Subsequently, a masking step that etches multiple vias down to a first level metal is performed on the dielectric layer. Thereafter, deposition and etching are performed to form a multi-level interconnect structure.

Regardless of the method by which a multi-level interconnect is formed, the use of a material having a very low dielectric property (ie., a dielectric constant of less than 2.5) as a dielectric layer within the multi-level interconnect structure is critical for the performance of an IC device. At one point, porous silica, such as aerogel or xerogel, was being considered by the semiconductor industry as a possible candidate for the dielectric layer because of its low dielectric constant. For example, bulk aerogel has a dielectric constant of approximately 1.0, and xerogel has a dielectric constant of approximately 1.7. However, materials having a low dielectric constant as a group typically also have extremely low thermal conductivity, and porous silica such as aerogel and xerogel are no exception.

One problem that may arise due to the low thermal conductivity of a dielectric layer is that "hot spots" can be formed during wafer processing. For example, during the photoresist pattern exposure and development stage of wafer processing, the interconnect typically heats up; and because the heat cannot be dissipated by the dielectric layer, the photoresist will become very hot around the region of the interconnect. As a result, the photoresist may bubble, burn, or reticulate to a point that can make the patterning process tremendously difficult. As a result, the use of porous silica as a dielectric medium within a semiconductor device is considered as impractical by the semiconductor industry at large.

SUMMARY OF THE INVENTION

In contravention of the current practice of the semiconductor industry, the present invention utilizes porous silica as a dielectric material in an IC device having a multi-layer interconnect structure. In accordance with a method of the present invention, a layer of precursor material is first deposited on a silicon substrate. Without affecting its structure and porosity, the layer of silica precursor material is then dried and becomes a layer of porous silica film. Subsequently, the silicon substrate is exposed to a methane gas atmosphere at a temperature of approximately 200–350° C., during which methane gas molecules are oxidized locally to liberate carbon atoms. Some of the liberated carbon atoms will bond to the interior of the porous silica film. The carbon atoms from the methane gas molecules then permeate the nanopores within the porous silica film such that the entire nanostructure of the porous silica film is carbidized. As a result, a composite porous silica film, which may serve as a dielectric layer for an interconnect structure within a semiconductor device, is formed. This composite porous silica film has a relatively low dielectric constant and is able to distribute heat by virtue of its carbidization.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
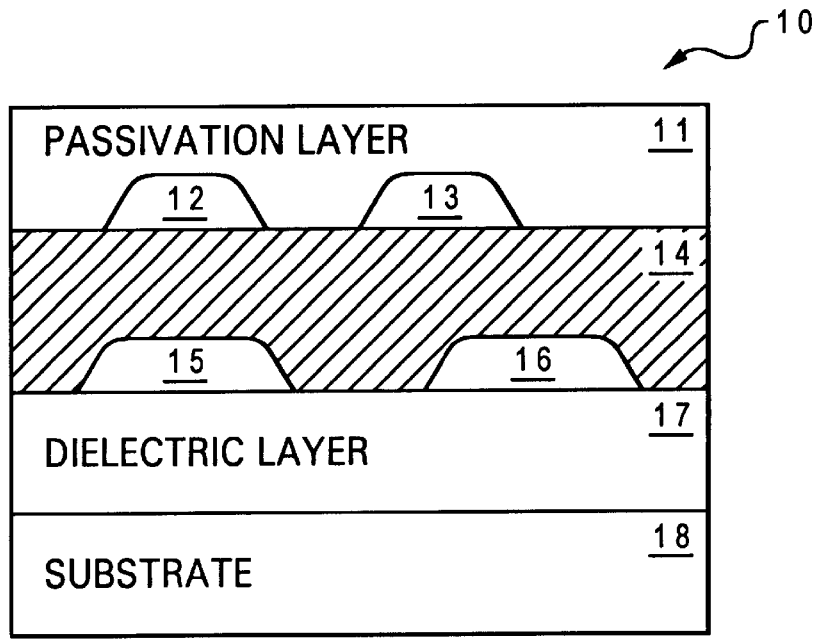
FIG. 1 is a cross-sectional view of an exemplary semiconductor structure in which a preferred embodiment of the present invention may be incorporated.

Referring now to the drawings and in particular to FIG. 1, there is illustrated a cross-sectional view of a semiconductor structure 10 in which a preferred embodiment of the present invention may be incorporated. To form semiconductor structure 10, a dielectric layer 17 is formed on top of a substrate 18 using a well-known deposition technique such as chemical vapor deposition (CVD) or spin-on. Substrate 18 is preferably made of silicon. A layer of metal, such as aluminum alloy and its barrier stack, is then deposited on dielectric layer 17. Metal lines may subsequently be formed by masking and etching the metal layer as is well-known in the art. For example, with the assistance of a mask, a photolithographic and reactive ion etch technique may be utilized to remove portions of the metal layer. As illustrated, semiconductor structure 10 includes two metal lines 15, 16 formed on top of dielectric layer 17.

An inter-metal dielectric layer 14 is then deposited on top of dielectric layer 17 and metal lines such as metal lines 15, 16. Inter-metal dielectric layer 14 can be made of the same dielectric medium as dielectric medium 17. At this point, a second level of metal lines may be formed on top of inter-metal dielectric layer 14 by masking and etching as is well-known in the art. As illustrated, two metal lines 12, 13 are formed on top of inter-metal dielectric layer 17. Finally, a passivation layer 11 is deposited on top of inter-metal dielectric layer 17 and second level metal lines such as metal lines 12, 13. Passivation layer 11 can be made of nitride or parylene.

Figure 2:
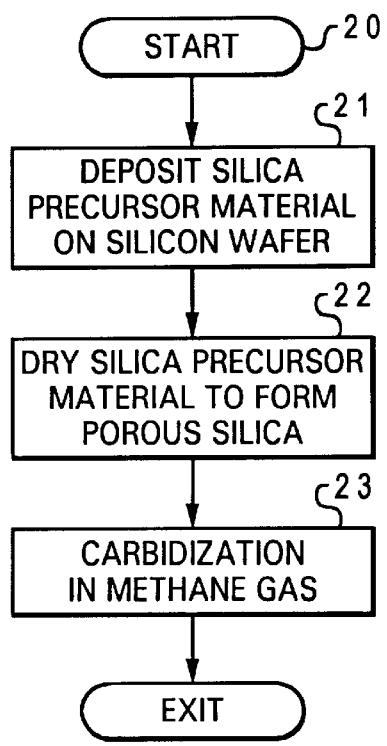
FIG. 2 is a high-level logic flow diagram of a method for composing a thermally conductive thin film layer having a low dielectric property, in accordance with a preferred embodiment of the present invention.

With reference now to FIG. 2, there is illustrated a high-level logic flow diagram of a method for composing a thermally conductive thin film layer having a low dielectric property to be used within semiconductor structure 10 from FIG. 1, in accordance with a preferred embodiment of the present invention. Starting at block 20, a layer of silica precursor material is first deposited on a silicon wafer (i.e., substrate 18 in FIG. 1), as shown in block 21. The deposition step is preferably performed by a spin-on process as is well-known to those skilled in the relevant art. The silica precursor material can be, for example, either tetraethylorthosilane (TEOS) gel or tetramethylorthosilicate (TMOS) gel. While retaining its structure and porosity, the layer of silica precursor material is then dried, as depicted in block 22; and the layer of silica precursor material becomes a layer of porous silica film. The drying step can be performed by various drying techniques that are well-known in the art. After the drying step, the entire silicon wafer is subsequently placed into a chamber filled with methane gas for carbidization, as illustrated in block 23.

The silicon substrate is exposed to the methane gas atmosphere at a temperature of approximately 200–350° C. The pressure within the chamber may be from approximately 100 mTorr to approximately 10 Torr. Under these conditions, methane gas molecules can be oxidized locally to liberate carbon atoms. The carbon atoms liberated from the methane gas molecules then permeate the nanopores within the porous silica film and bond to the interior of the porous silica film. Both the high surface area of the porous silica film and the high process temperature contribute a catalytic effect for the chemical bonding between methane gas molecules and the porous silica film. As a result, the entire nanostructure of the porous silica film is carbidized to form a composite porous silica film.

This composite porous silica film has a very low dielectric constant and a thermal conductivity that is high enough to distribute heat rapidly when needed. The relatively low dielectric constant is attributable to the intrinsic properties of the porous silica, and the thermal conductivity is attributable to the carbidized components within the silica matrix. As such, the composite porous silica film can serve as a dielectric layer, such as dielectric layers 14 and 17 in FIG. 1, within a semiconductor device.

As has been described, the present invention provides a method for forming a thermal conductive low dielectric thin film within a multilayer semiconductor device. Even though methane gas is preferable to be used for the carbidization of a porous silica film, it is understood that other type of alkane gas can also be used. Furthermore, although a dielectric layer within an semiconductor structure is utilized to illustrate a preferred embodiment of the present invention, the principle as disclosed can also be applicable to any other IC structure having aerogel-type films.

While the invention has been particularly shown and described with reference to a preferred embodiment, it will be understood by those skilled in the art that various changes in form and detail may be made therein without departing from the spirit and scope of the invention.

What is claimed is:

1. A method for composing a thermally conductive dielectric layer within a semiconductor device, said method comprising the steps of:

depositing a layer of silica precursor material on a substrate;

drying said layer of silica precursor material to form a porous silica film; and carbidizing said porous silica film in an alkane gas atmosphere at an elevated temperature.

2. The method according to claim 1, wherein said depositing step is performed by a spin-on process.

3. The method according to claim 1, wherein said drying step further includes a step of drying said layer of silica precursor material while retaining its microstructure and porosity.

4. The method according to claim 1, wherein said alkane gas is methane gas and said elevated temperature is approximately 200–350° C.

5. The method according to claim 1, wherein said carbidizing step is performed at a pressure between approximately 100 mTorr and approximately 10 Torr.

6. The method according to claim 1, wherein said silica precursor material can be either tetraethylorthosilane gel or tetramethylorthosilicate gel.

7. The method according to claim 1, wherein said substrate is silicon.

* * * * *